(12) United States Patent
Lin et al.

(10) Patent No.: US 11,440,051 B2
(45) Date of Patent: Sep. 13, 2022

(54) CAPACITIVE MICROMACHINED ULTRASONIC TRANSDUCER (CMUT) DEVICES AND METHODS OF MANUFACTURING

(71) Applicant: General Electric Company, Schenectady, NY (US)

(72) Inventors: Yizhen Lin, Schenectady, NY (US); Marco Francesco Aimi, Niskayuna, NY (US); Alessandro Stuart Savoia, Rome (IT)

(73) Assignee: GENERAL ELECTRIC COMPANY, Schenectady, NY (US)

(*) Notice: Subject to any disclaimer, the term of this patent is extended or adjusted under 35 U.S.C. 154(b) by 423 days.

(21) Appl. No.: 16/802,345

(22) Filed: Feb. 26, 2020

(65) Prior Publication Data

US 2021/0260622 A1   Aug. 26, 2021

(51) Int. Cl.
*H01L 21/00*   (2006.01)
*B06B 1/02*   (2006.01)
(Continued)

(52) U.S. Cl.
CPC .......... *B06B 1/0292* (2013.01); *B81B 3/0021* (2013.01); *B81C 1/00357* (2013.01);
(Continued)

(58) Field of Classification Search
CPC ................ B06B 1/0292; B81B 3/0021; B81B 2201/0271; B81B 2203/0127; B81B 2207/012; B81B 2207/07; B81C 2201/0125; B81C 2201/0132; B81C 2201/0194; B81C 2203/0109; B81C 2203/0792
See application file for complete search history.

(56) References Cited

U.S. PATENT DOCUMENTS 9,242,273 B2   1/2016   Ho et al.
9,937,528 B2   4/2018   Johnson et al.
(Continued)

FOREIGN PATENT DOCUMENTS

WO   2013089648 A1   6/2013

OTHER PUBLICATIONS

Zhang, "Fabrication of Capacitive Micromachined Ultrasonic Transducers with Through-Glass-Via Interconnects", IEEE International Ultrasonics Symposium Proceedings, 2015, 4 pages.
(Continued)

*Primary Examiner* — Samuel A Gebremariam
(74) *Attorney, Agent, or Firm* — The Small Patent Law Group LLC; Dean D. Small

(57) ABSTRACT

A method of forming a capacitive micromachined ultrasonic transducer (CMUT) device includes bonding a CMUT substrate to a silicon on insulator (SOI) substrate. The CMUT substrate has a first thickness and the SOI substrate includes a handle, a buried oxide layer, and a device layer. At least one of the CMUT substrate or the SOI substrate includes a patterned dielectric layer. The device layer is bonded to the patterned dielectric layer to form a plurality of sealed cavities and the device layer forms a diaphragm of the plurality of cavities. The method further includes reducing the first thickness of the CMUT substrate to a second thickness and forming a plurality of through-silicon vias from a second surface of the CMUT substrate opposite the first surface.

20 Claims, 14 Drawing Sheets

(51) Int. Cl.
 *B81B 3/00*   (2006.01)
 *B81C 1/00*   (2006.01)
(52) U.S. Cl.
 CPC .......... *B81B 2201/0271* (2013.01); *B81B 2203/0127* (2013.01); *B81B 2207/012* (2013.01); *B81B 2207/07* (2013.01); *B81C 2201/0125* (2013.01); *B81C 2201/0132* (2013.01); *B81C 2201/0194* (2013.01); *B81C 2203/0109* (2013.01); *B81C 2203/0792* (2013.01)

(56) References Cited

U.S. PATENT DOCUMENTS

| | | |
|---|---|---|
| 10,175,206 B2 | 1/2019 | Rothberg et al. |
| 10,335,827 B2 | 7/2019 | Johnson et al. |
| 2017/0232474 A1 | 8/2017 | Oralkan et al. |
| 2017/0365774 A1 | 12/2017 | Rothberg et al. |
| 2018/0141803 A1 | 5/2018 | Schelling |
| 2018/0257927 A1 | 9/2018 | Rothberg |

OTHER PUBLICATIONS

Zang, "Fabrication of Vacuum-Sealed Capacitive Micromachined Ultrasonic Transducers with Through-Glass-Via Interconnects Using Anodic Bonding", Journal of Microelectromechanical Systems, Feb. 2017, 9 pages, vol. 26, No. 1.
Roy, "Fabrication of High-Efficiency CMUTs with Reduced Parasitics Using Embedded Metallic Layers", IEEE Sensory Journal, Jul. 1, 2017, 8 pages, vol. 17, No. 13.
CN application 202110206829.7 filed Feb. 24, 2021—Office Action dated Mar. 2, 2022.

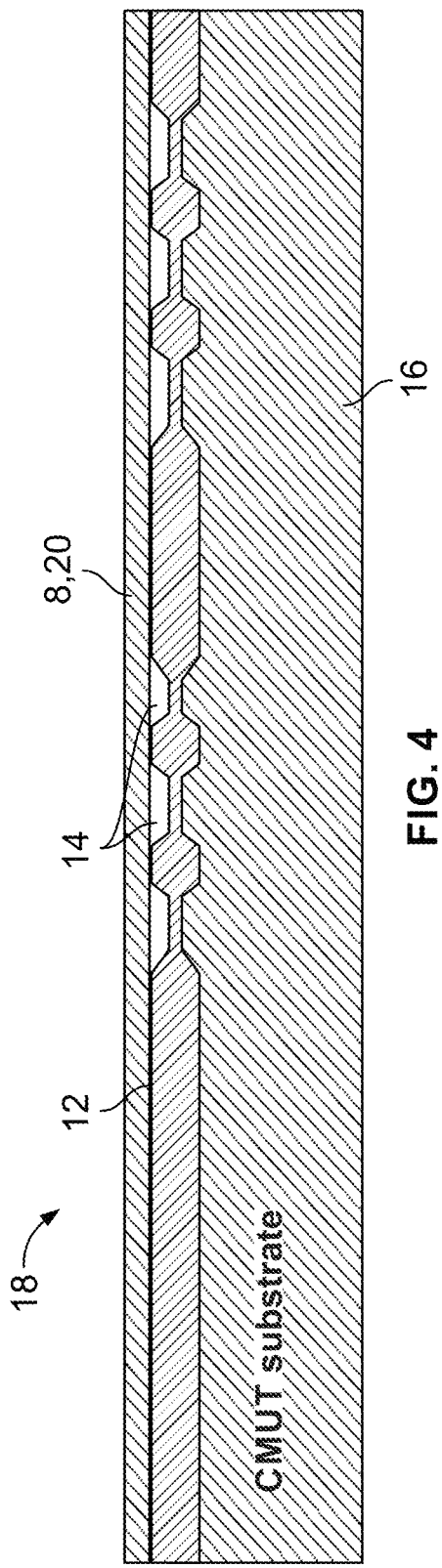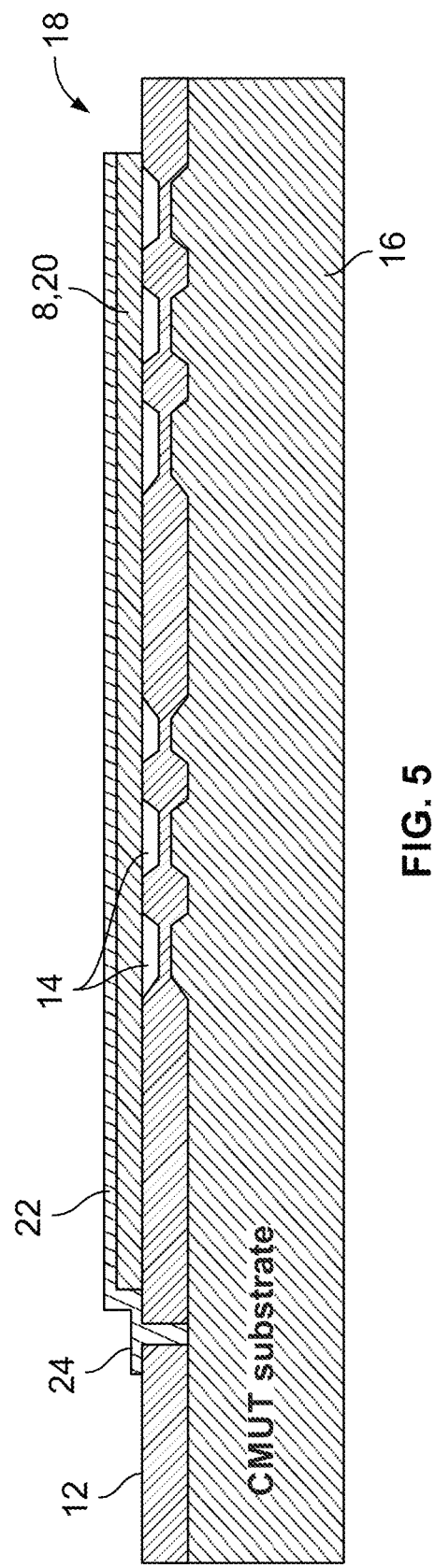

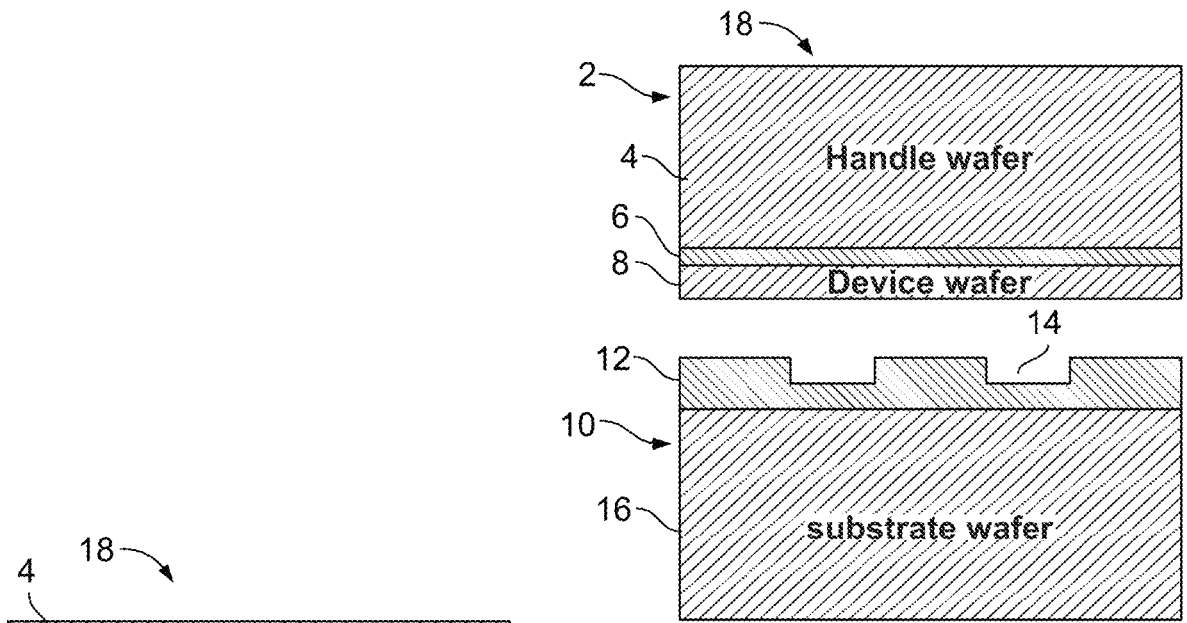
FIG. 15
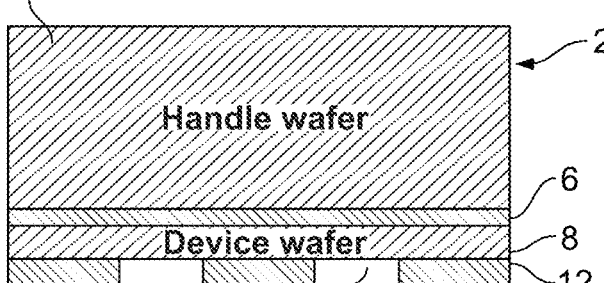
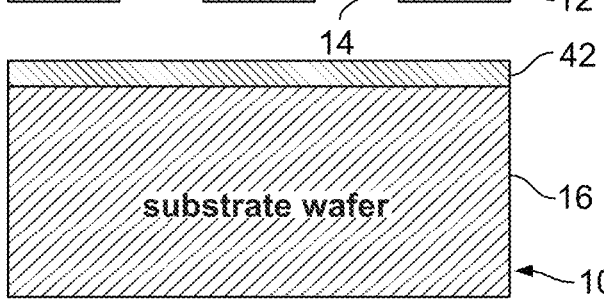
FIG. 16
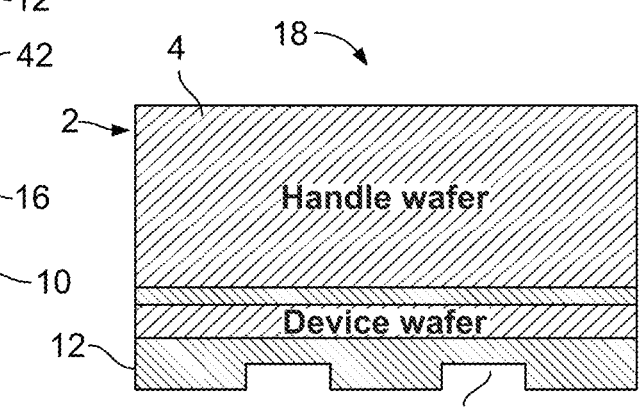
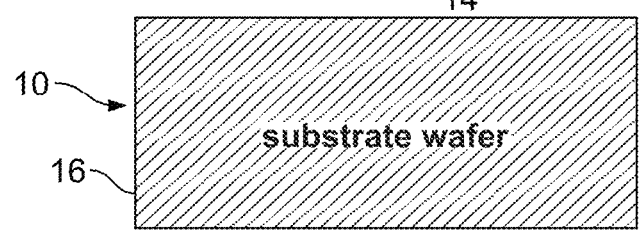
FIG. 17

CAPACITIVE MICROMACHINED ULTRASONIC TRANSDUCER (CMUT) DEVICES AND METHODS OF MANUFACTURING

BACKGROUND

Embodiments of the disclosure generally relate to capacitive micromachined ultrasonic transducer (CMUT) devices and methods of manufacturing CMUT devices.

Existing CMUT technology may be limited by large parasitics. This problem may be exacerbated by the need to integrate a CMUT onto a CMOS wafer by through-silicon (or through-substrate) via (TSV) technology. CMUT devices may be built on a silicon substrate which for rigidity and wafer handling may have a thickness of 300 µm to 750 TSV's through the silicon substrate that electrically connect an ASIC to the CMUT top plate may create large parasitics which results in low CMUT efficiency.

SUMMARY

According to an embodiment, a method of manufacturing a CMUT device includes bonding a CMUT substrate to a silicon on insulator (SOI) substrate, the CMUT substrate having a first thickness, the SOI substrate including a handle, a buried oxide layer, and a device layer, at least one of the CMUT substrate or the SOI substrate including a patterned dielectric layer, wherein the device layer is bonded to the patterned dielectric layer to form a plurality of sealed cavities and the device layer forms a diaphragm of the plurality of cavities; reducing the first thickness of the CMUT substrate to a second thickness; and forming a plurality of through-silicon vias from a second surface of the CMUT substrate opposite the first surface.

According to an embodiment, a CMUT device is manufactured according to a method that includes bonding a CMUT substrate to a silicon on insulator (SOI) substrate, the CMUT substrate having a first thickness, the SOI substrate including a handle, a buried oxide layer, and a device layer, at least one of the CMUT substrate or the SOI substrate including a patterned dielectric layer, wherein the device layer is bonded to the patterned dielectric layer to form a plurality of sealed cavities and the device layer forms a diaphragm of the plurality of cavities; reducing the first thickness of the CMUT substrate to a second thickness; and forming a plurality of through-silicon vias from a second surface of the CMUT substrate opposite the first surface.

DRAWINGS

These and other features, aspects, and advantages of the present disclosure will become better understood when the following detailed description is read with reference to the accompanying drawings, wherein:

FIG. 1 schematically illustrates a silicon-on-insulator (SOI) substrate used in manufacturing a CMUT device according to an embodiment;

FIG. 2 schematically illustrates a substrate wafer used in manufacturing a CMUT device according to an embodiment;

FIG. 3 schematically illustrates the substrates of FIGS. 1 and 2 bonded together for manufacturing a CMUT device according to embodiments;

FIG. 4 schematically illustrates the bonded substrates of FIG. 3 during manufacturing of a CMUT device according to an embodiment;

FIG. 5 schematically illustrates the bonded substrate of FIG. 4 during manufacturing of a CMUT device according to an embodiment;

FIG. 6 schematically illustrates the bonded substrate of FIG. 5 having a temporary cap bonded thereto during manufacturing of a CMUT device according to an embodiment;

FIG. 7 schematically illustrates the bonded substrate of FIG. 6 after further processing during manufacturing of a CMUT device according to an embodiment;

FIG. 8 schematically illustrates the bonded substrate of FIG. 7 assembled to a device during manufacturing of a CMUT device according to an embodiment;

FIG. 9 schematically illustrates the bonded substrates of FIG. 3 during manufacturing of a CMUT device according to an embodiment;

FIG. 10 schematically illustrates a through-glass via (TGV) interposer for bonding to the bonded substrates of FIG. 9;

FIG. 11 schematically illustrates the bonded substrates of FIG. 9 and the TGV interposer of FIG. 10 bonded during manufacturing of a CMUT device according to an embodiment;

FIG. 12 schematically illustrates the bonded substrate and TGV interposer of FIG. 11 after further processing during manufacturing of a CMUT device according to an embodiment;

FIG. 13 schematically illustrates the bonded substrates of FIG. 3 after processing during manufacturing of a CMUT device according to an embodiment;

FIG. 14 schematically illustrates the bonded substrates of FIG. 13 after further processing during manufacturing of a CMUT device according to an embodiment;

FIG. 15 schematically illustrates an SOI wafer and a substrate wafer for manufacturing a CMUT device according to an embodiment;

FIG. 16 schematically illustrates an SOI wafer and substrate wafer for manufacturing a CMUT device according to an embodiment;

FIG. 17 schematically illustrates an SOI wafer and substrate wafer for manufacturing a CMUT device according to an embodiment;

FIG. 18 schematically illustrates the bonded wafers of FIG. 3 during manufacturing a CMUT device according to an embodiment;

FIG. 19 schematically illustrates a CMUT cell;

FIG. 20 schematically illustrates a CMUT device;

Figure 24:
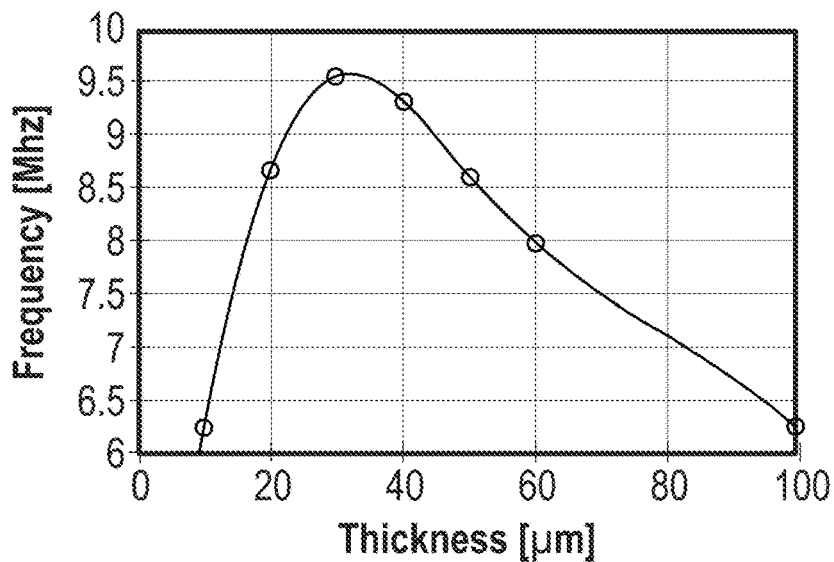
Figure 25:
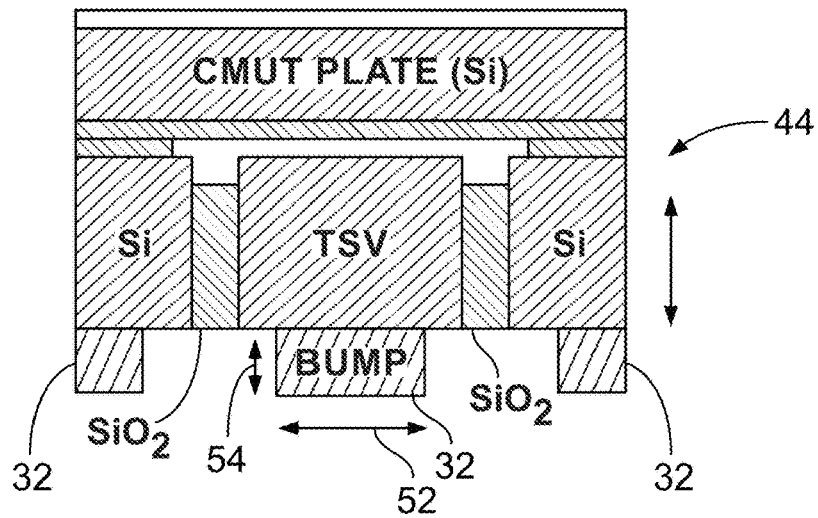
Figure 26:
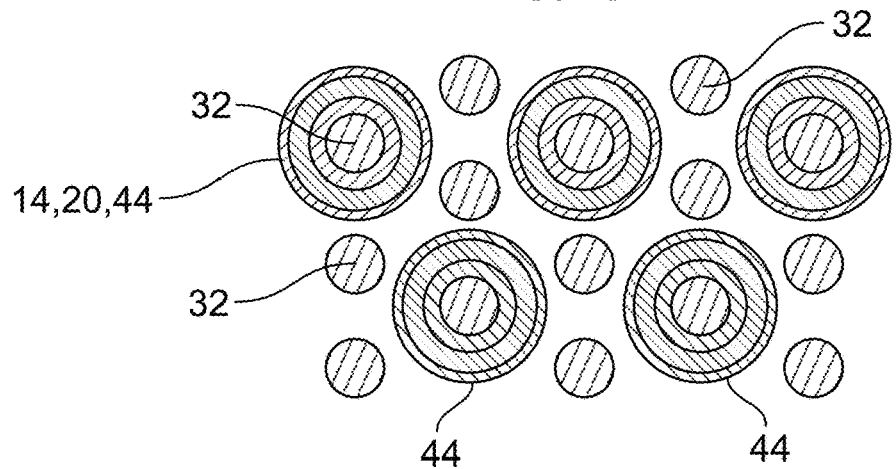
Figure 27:
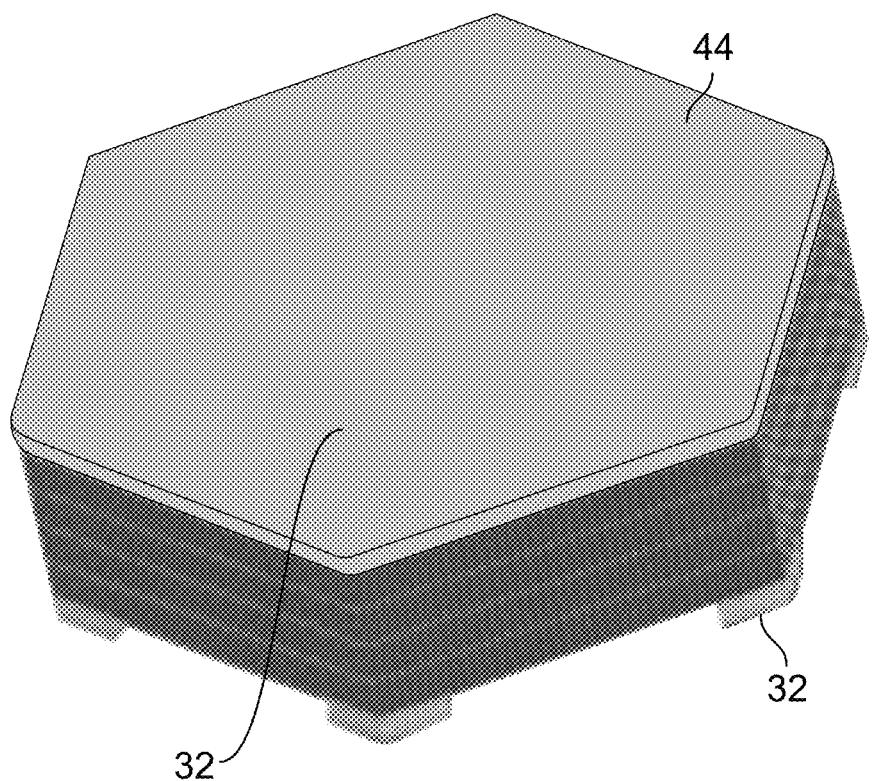
Figure 28:
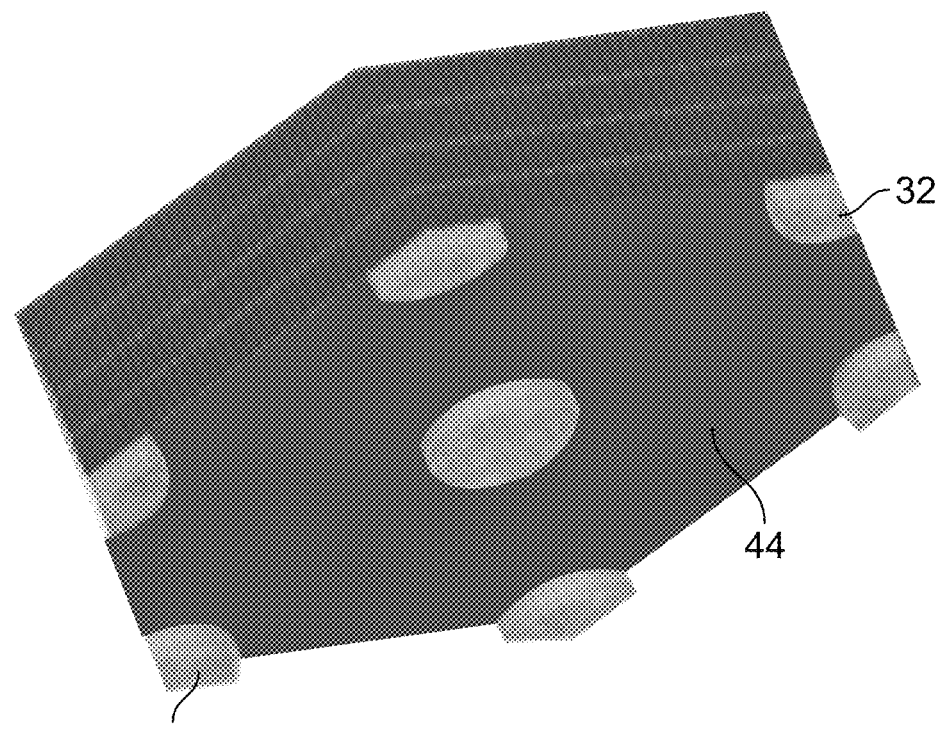

FIG. 24 schematically illustrates a relationship between a spurious vibration mode frequency versus CMUT diaphragm thickness;

FIG. 25 schematically illustrates a CMUT cell with bond posts;

FIG. 26 schematically illustrates a bond post layout;

FIG. 27 schematically illustrates a top view of the bond post layout of FIG. 26; and FIG. 28 schematically illustrates a bottom view of the bond post layout of FIG. 26.

DETAILED DESCRIPTION

In the following specification and the claims, which follow, reference will be made to terms which shall be defined to have the following meanings. The singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value solidified by a term or terms, such as "about", and "substantially" is not to be limited to the precise value specified. In some instances, the approximating language may correspond to the precision of an instrument for measuring the value. Similarly, "free" may be used in combination with a term, and may include an insubstantial number, or trace amounts, while still being considered free of the solidified term. Here and throughout the specification and claims, range limitations may be combined and/or interchanged, such ranges are identified and include all the sub-ranges contained therein unless context or language indicates otherwise. The terms "disposed inside" or "disposed in" refer to configurations in which at least portion of a component is disposed inside or within a portion of another component and does not necessarily connotate that the entirety of the component needs to be disposed within another component.

Figure 1:
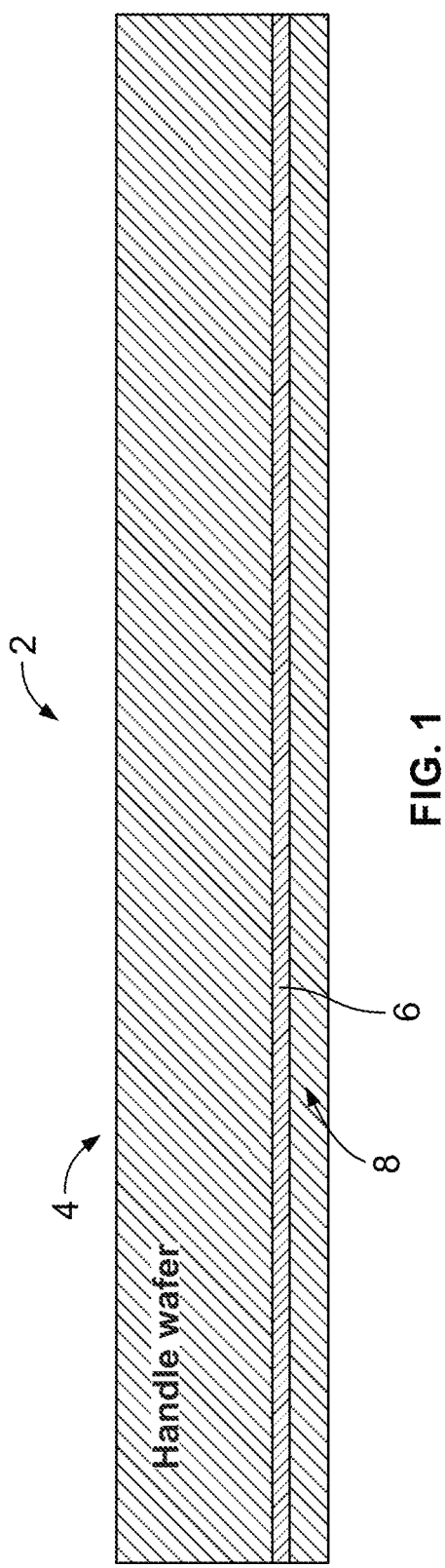
Figure 2:
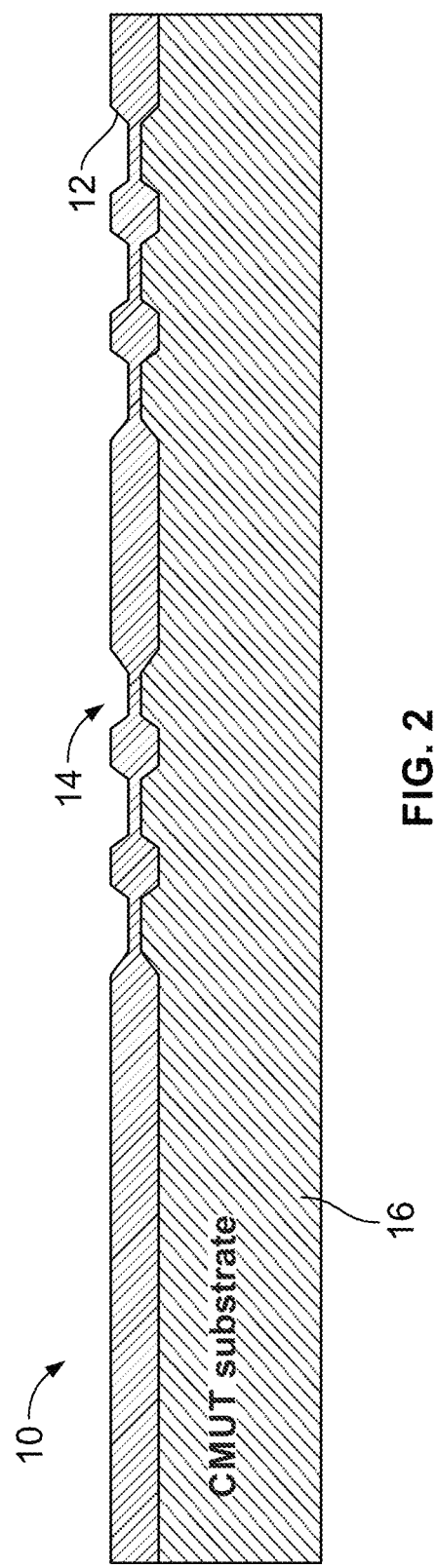

Referring to FIG. 1, a silicon-on-insulator wafer 2 for use in manufacturing a CMUT device comprises a handle wafer 4, a buried oxide (BOX) layer 6, and a device layer 8. The device layer 8 may have a thickness of, for example, 1 μm to 20 μm. The device layer thickness may be less than 1 μm. The handle wafer 4 may have a thickness sufficient to provide structural support during manufacturing of the CMUT device. Referring to FIG. 2 a substrate wafer 10 includes a CMUT substrate 16. The CMUT substrate 16 has a dielectric layer 12 formed on one of its surfaces. The dielectric layer 12 may be patterned to include a plurality of cavities 14. The CMUT substrate 16 may have a thickness of, for example, 300 μm to 750 μm.

Figure 3:
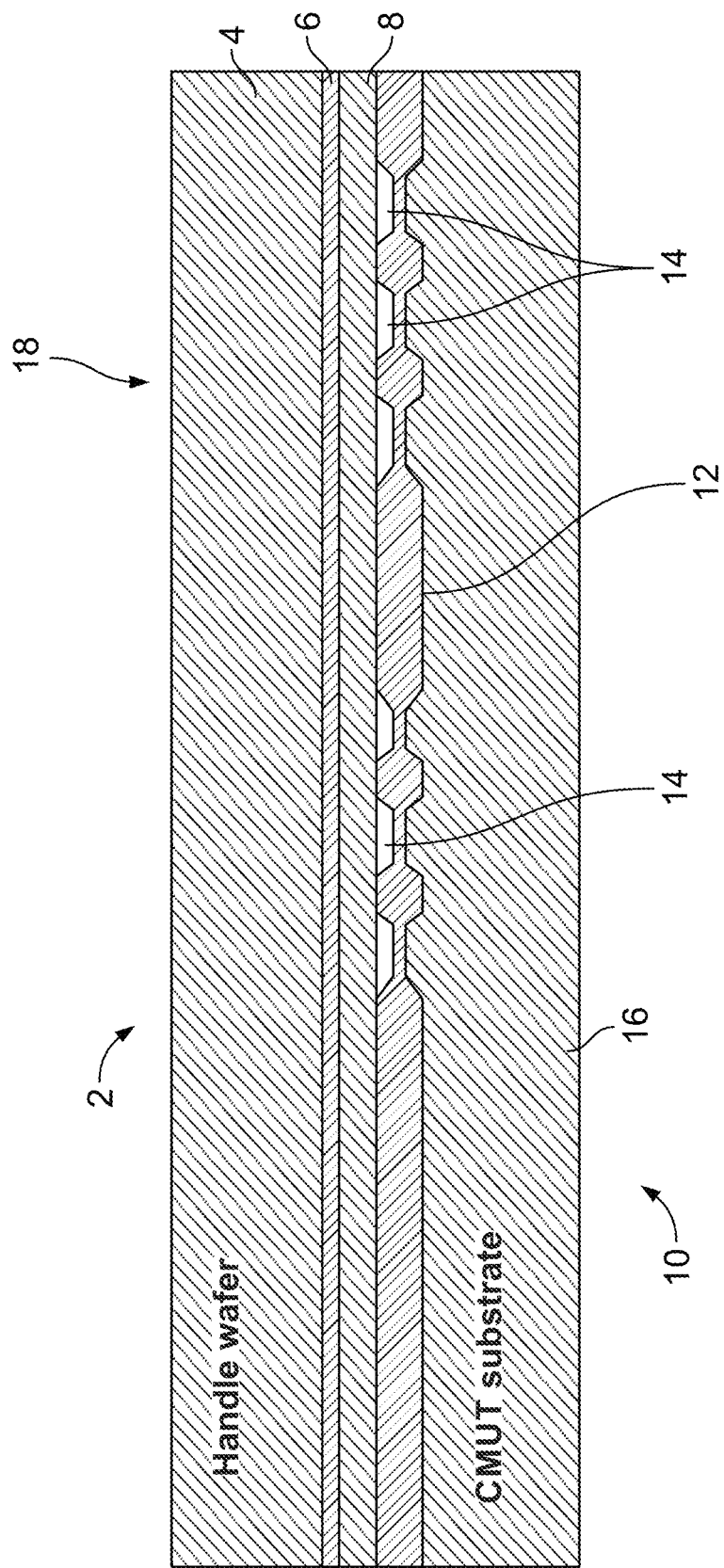

Referring to FIG. 3, the SOI wafer 2 and the substrate wafer 10 may be bonded together. The device layer 8 of the SOI wafer 2 is bonded to the patterned dielectric layer 12 and seals the cavities 14 of the patterned dielectric layer 12. The SOI wafer 2 and the substrate wafer 10 may be bonded by together by, for example, a low temperature fusion bond followed by a high temperature anneal. The bonded SOI wafer 2 and substrate wafer 10 form a bonded substrate 18. The SOI wafer 2 and the substrate wafer 10 may be bonded in a vacuum.

Referring to FIG. 4, a method of manufacturing a CMUT device according to an embodiment includes removing the handle wafer 4 and the BOX layer 6 of the bonded substrate 18. The handle wafer 4 and the BOX layer 6 may be removed by, for example, grinding and/or etching. The device layer 8 remains sealed to the patterned dielectric layer 12 and will form a CMUT membrane or diaphragm 20 of the CMUT device.

Referring to FIG. 5, the method further comprises etching a portion of the device layer 8 to form the CMUT diaphragm 20 and portions of the dielectric layer 12 to form a contact area. A metal layer 22 is formed over the CMUT diaphragm 20 and the contact area. The metal layer 22 over the contact layer forms a contact 24 of the CMUT device.

Figure 6:
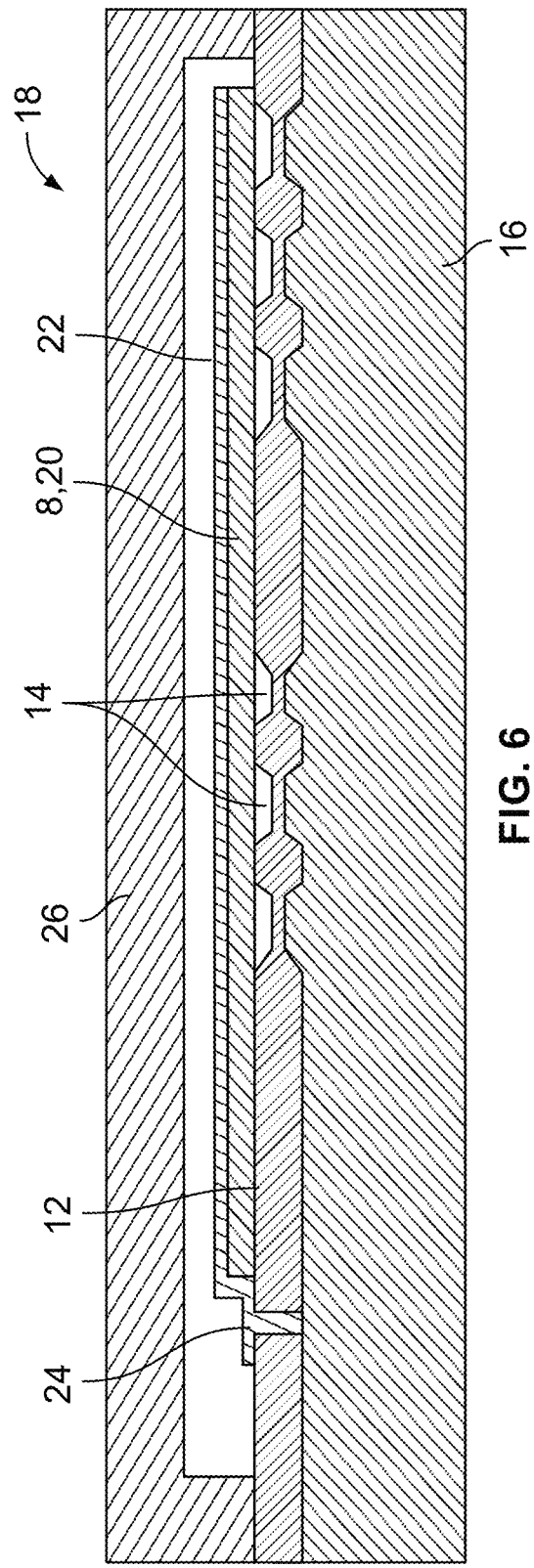
Figure 7:
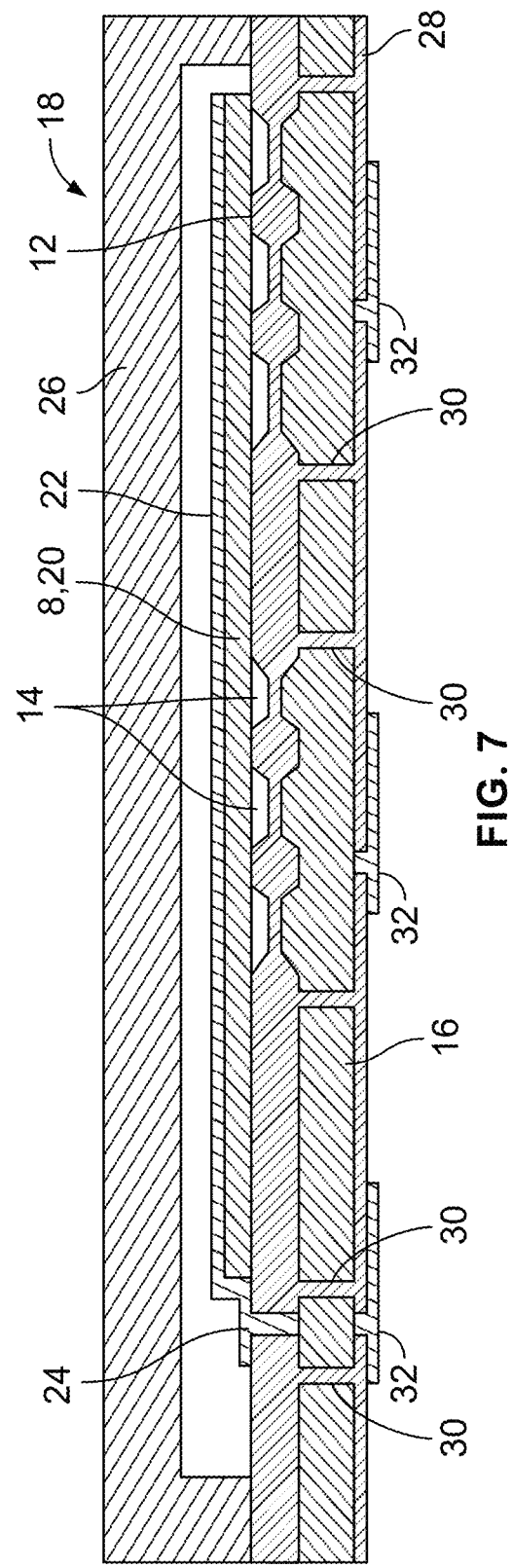

Referring to FIG. 6, the method further includes bonding a cap 26 to the bonded substrate 18 over the CMUT diaphragm 20, metal layer 22, and contact 24. The cap 26 may be formed of, for example, silicon, glass, or metal. The cap 26 may be bonded to the bonded substrate 18 by, for example, epoxy or solder. After the cap 26 is bonded to the bonded substrate 18, the thickness of the CMUT substrate 16 is reduced, for example by grinding, as shown in FIG. 7. The cap 26 supports the bonded substrate 18 while the CMUT substrate 16 is reduced in thickness. The CMUT substrate 16 may be reduced from an initial thickness of 300 μm to 750 μm to a thickness of 20 μm to 50 μm, for example 30 μm. The reduced thickness CMUT substrate 16 is then etched to form isolation regions and a dielectric layer 28 is formed on the surface of the reduced thickness CMUT substrate 16 and TSV's 30 are formed through the reduced thickness CMUT substrate 16. Metal bumps or bond posts 32 are formed through and on the dielectric layer 28.

Figure 8:
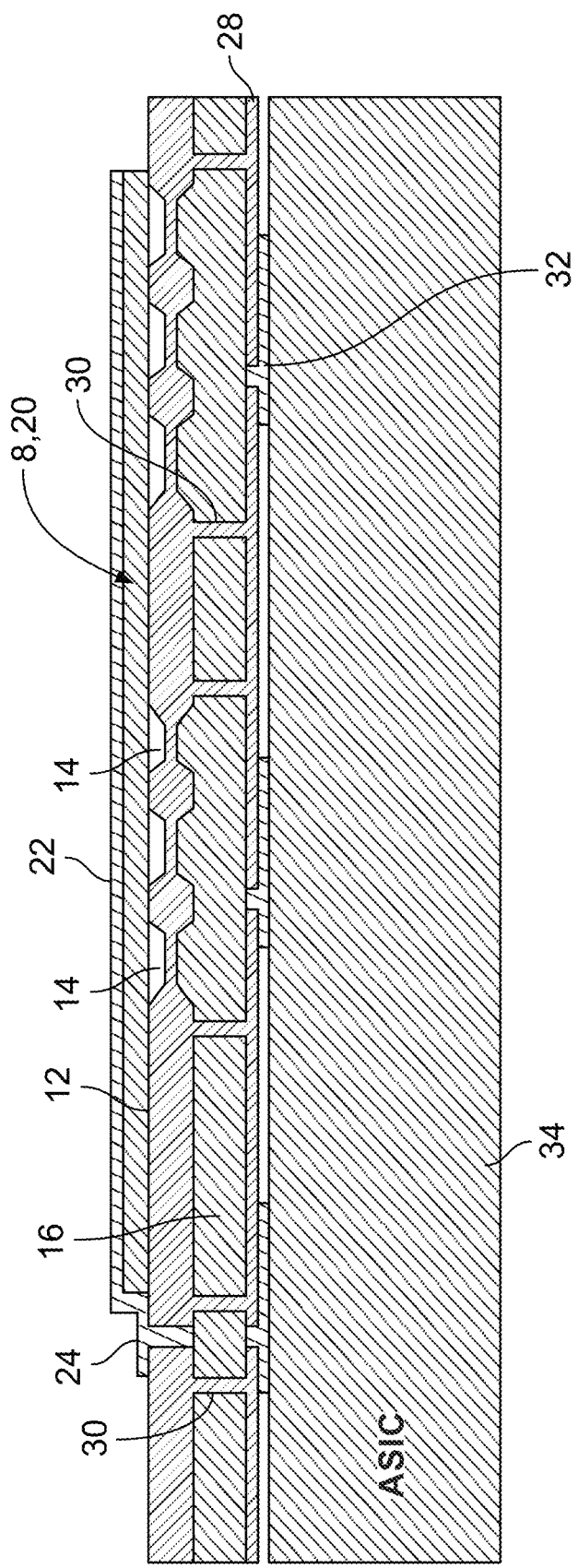
Figure 9:
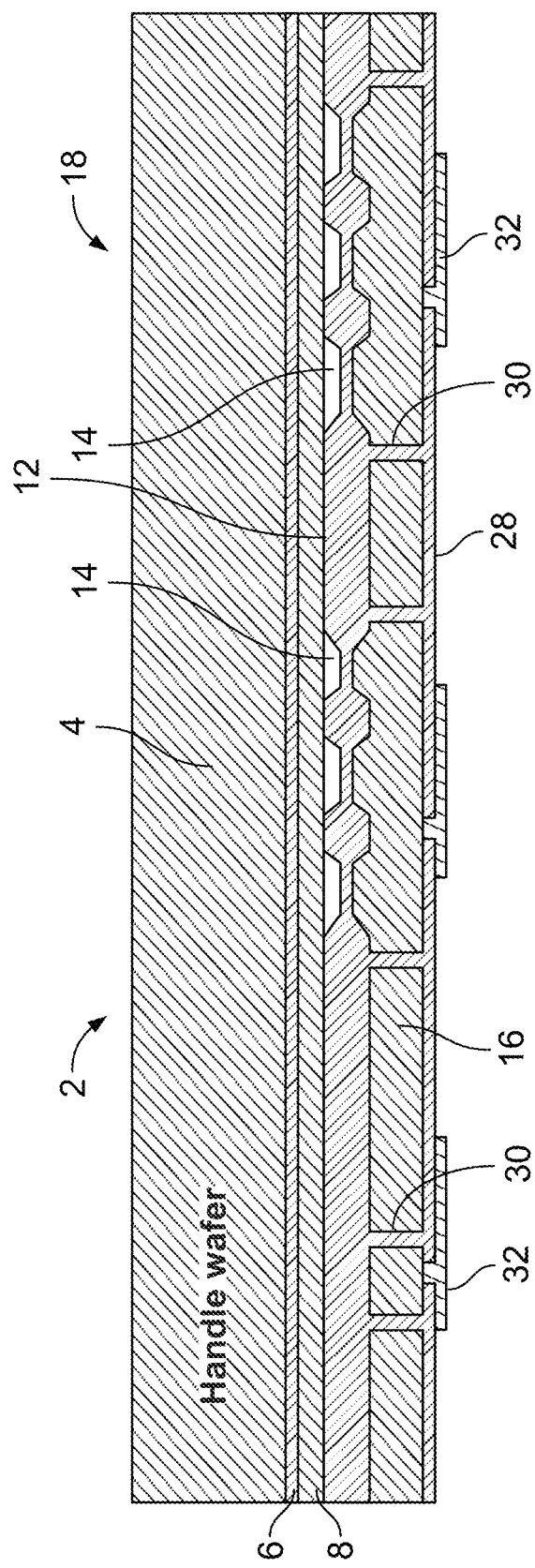
Figure 10:
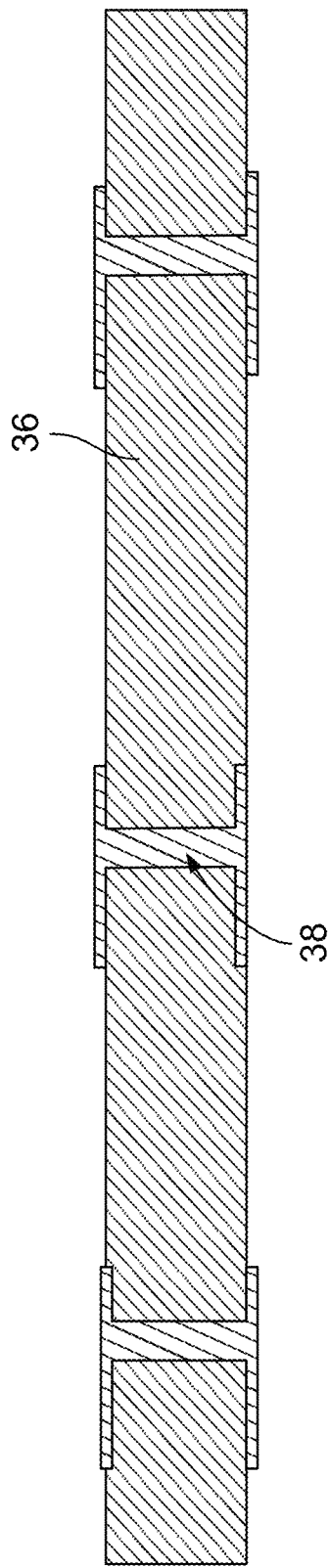

Referring to FIG. 8, an application specific integrated circuit (ASIC) 34 is assembled to the bonded substrate 18 at the bond posts to complete assembly of the CMUT device. The cap 26 may remain on the bonded substrate 18 during assembly with the ASIC 34 to provide structural support. The cap 26 may then be removed once assembly of the ASIC 34 to the bonded substrate 18 is complete.

Referring to FIGS. 9-12, a method according to an embodiment includes reducing the thickness of the CMUT substrate 16. The CMUT substrate 16 is reduced in thickness, for example by grinding. The CMUT substrate 16 may be reduced from an initial thickness of 300 μm to 750 μm to a thickness of 20 μm to 50 μm, for example 30 μm. The handle wafer 4 of the SOI wafer 2 is retained during the grinding of the CMUT substrate 16 to provide structural support. After the CMUT substrate 16 is reduced in thickness the reduced thickness CMUT substrate 16 is etched and a dielectric layer 28, TSV's 30, and bond posts 32 are formed in a manner similar to that described above.

Figure 11:
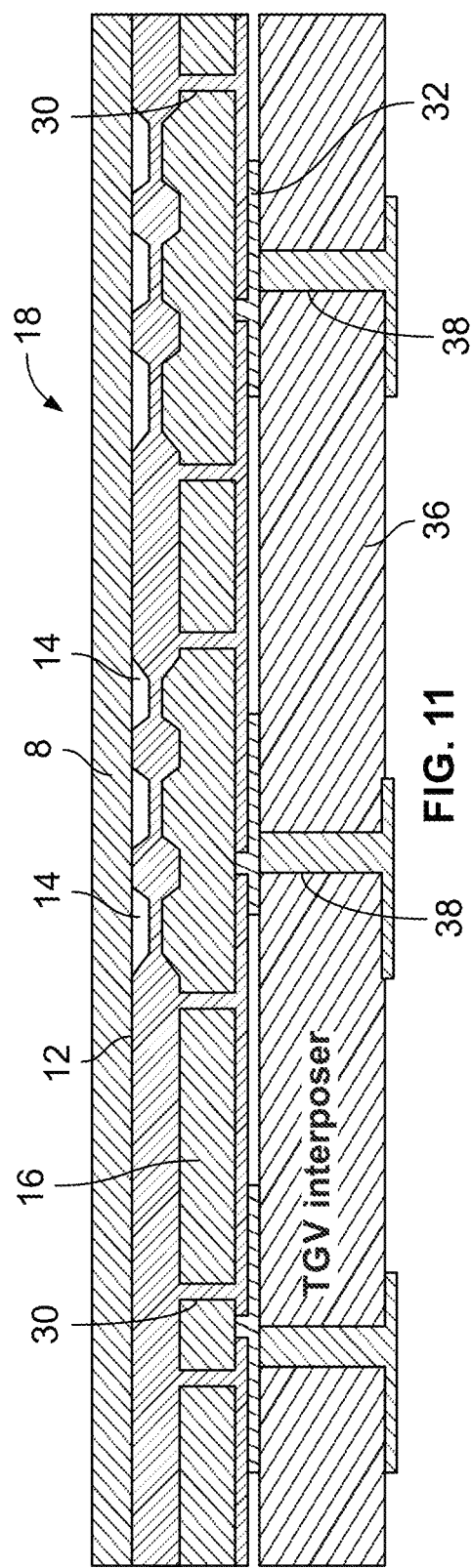
Figure 12:
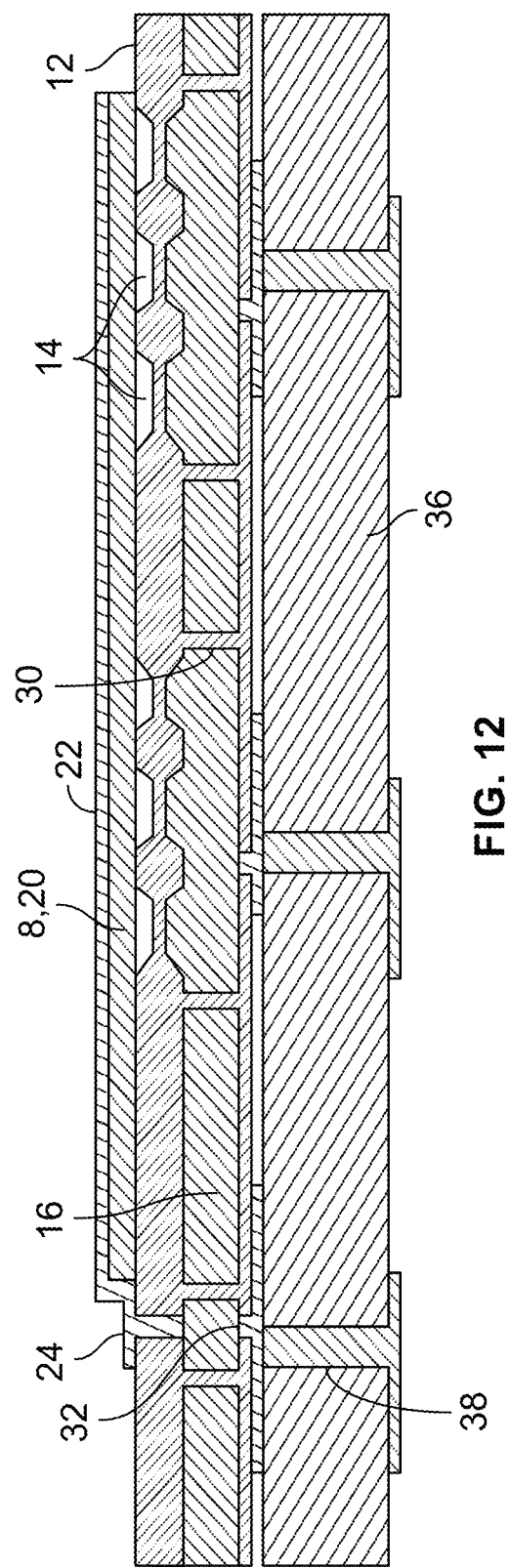

A glass wafer 36 having a through-glass via (TGV) 38 formed of metal, for example copper, is bonded to the bonded wafer 18. The TGV's 38 of the glass wafer 36 are bonded to corresponding bond posts 32 of the bonded wafer 18, as shown in FIG. 11. The glass wafer 36 and TGV's 38 increase the rigidity of the bonded wafer 18 without increasing parasitics. The glass wafer 36 and TGV's 38 provide very low parasitics. As further shown in FIG. 11, the handle wafer 4 and BOX layer 6 are removed in a manner similar to that described above. Referring to FIG. 12, the method further comprises etching portions of the device layer 8 and the dielectric layer 12 and forming a metal layer 22 to form a contact 24 in a manner similar to that described above.

Figure 13:
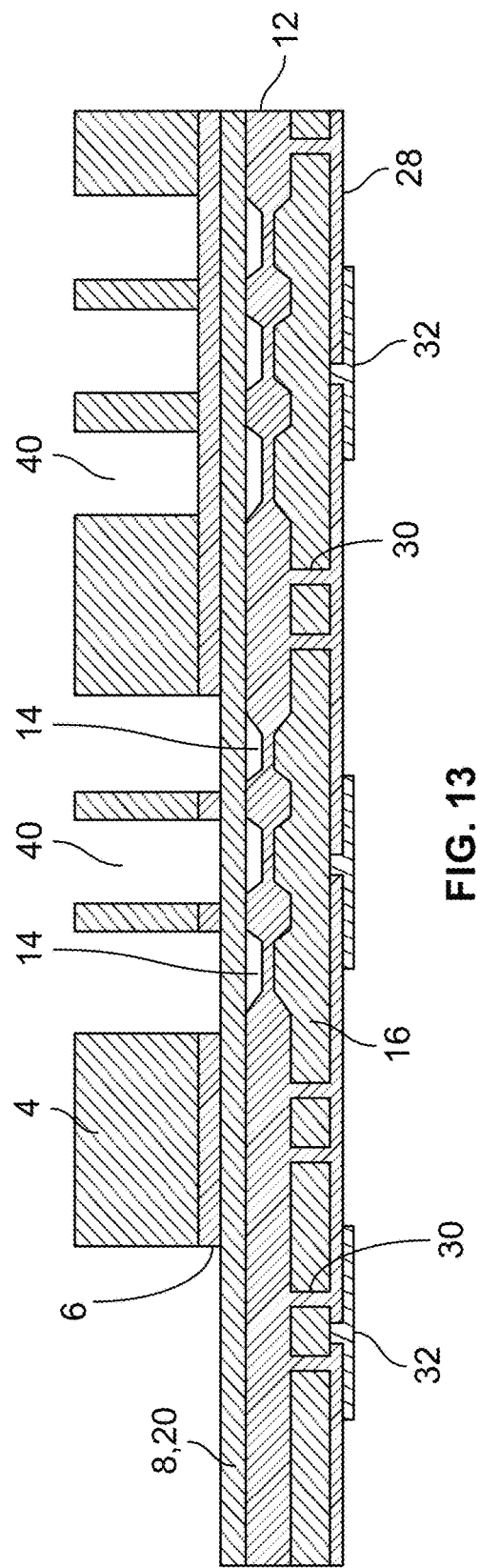
Figure 14:
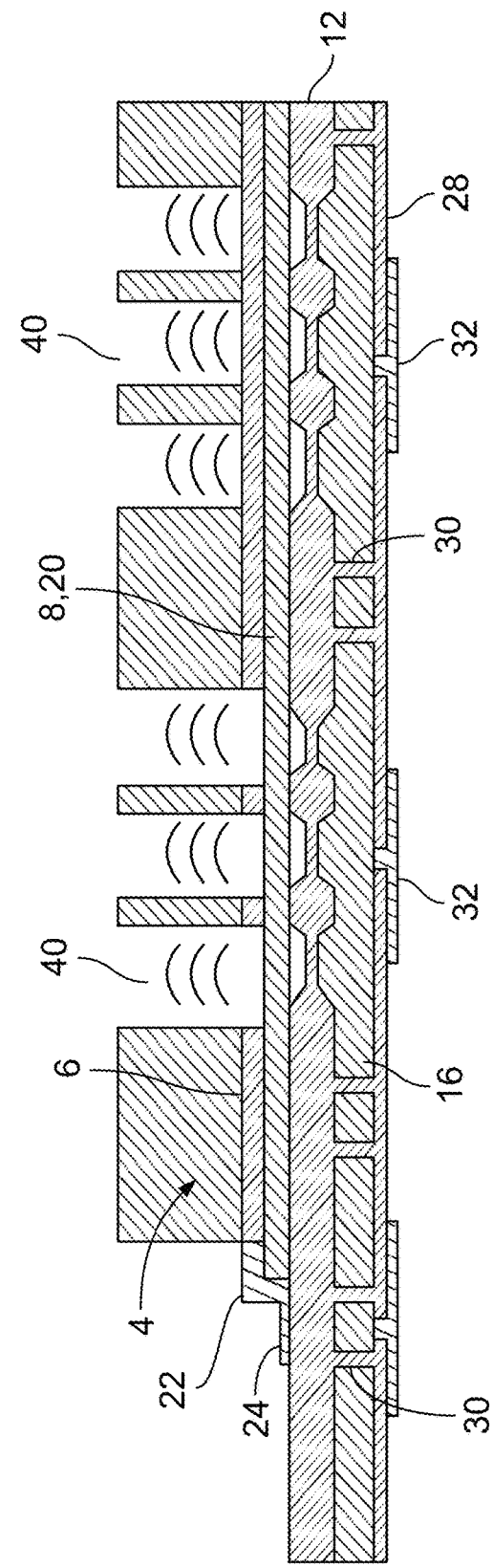

Referring to FIGS. 13 and 14, a method according to an embodiment comprises reducing the thickness of the CMUT substrate from an initial thickness of 300 μm to 750 μm to a thickness of 20 μm to 50 μm, for example 30 μm, in a manner similar to that described above. The handle wafer 4 and the BOX layer 6 are retained while the CMUT substrate 16 is reduced in thickness. The method further comprises forming a dielectric layer 28, TSV's 30, and bond posts 32 on the CMUT substrate in a manner similar to that described above.

Referring to FIG. 13, portions of the handle wafer 4 and the BOX layer 6 are etched to expose the device layer 8. The etched portions include waveguide channels 40 formed through the handle wafer 4 and the BOX layer 6 to expose the radiating CMUT diaphragm 20. The waveguide channels 40 may be formed by, for example, deep reactive ion etching. The waveguide channels may have a depth, or length, of the handle wafer, for example 300 μm to 750 μm. As shown in FIG. 14, further portions of the device layer 8 and the dielectric layer 12 are etched and a metal layer 22 is formed over the exposed portion of the diaphragm 20 and the dielectric layer 12 to form contact 24 in a manner similar to that described above.

Referring to FIG. 15, a bonded substrate usable in any of the methods described above comprises a SOI wafer 2 including a handle wafer 4, a BOX layer 6 and a device layer 8. The substrate wafer 10 comprises a CMUT substrate 16 and a patterned dielectric layer 12 that defines a plurality of cavities 14. The CMUT substrate may have a thickness of 300 μm to 750 μm. The SOI wafer 2 and the substrate wafer 10 may be bonded together in a manner similar to that described above to form the bonded substrate 18 having a plurality of sealed cavities 14, for example a plurality of sealed vacuum cavities.

Referring to FIG. 16, the SOI wafer 2 may comprise a handle wafer 4, a BOX layer 6, a device layer 8, and a patterned dielectric layer 12 defining a plurality of cavities 14. The substrate wafer 10 comprises a CMUT substrate 16 and a dielectric layer 42. The CMUT substrate may have a thickness of 300 μm to 750 μm. The SOI wafer 2 and the substrate wafer 10 may be bonded together in a manner similar to that described above to form the bonded substrate 18 having a plurality of sealed cavities 14, for example a plurality of sealed vacuum cavities. The dielectric layer 42 may also include a pattern in addition to the pattern of the dielectric layer 12.

Referring to FIG. 17, the SOI wafer 2 includes a handle wafer 4, a BOX layer 6, a device layer 8, and a patterned dielectric layer 12 defining a plurality of cavities 14. The substrate wafer comprises a CMUT substrate 16. The CMUT substrate may have a thickness of 300 μm to 750 μm. The SOI wafer 2 and the substrate wafer 10 may be bonded together in a manner similar to that described above to form the bonded substrate 18 having a plurality of sealed cavities 14, for example a plurality of sealed vacuum cavities.

Figure 18:
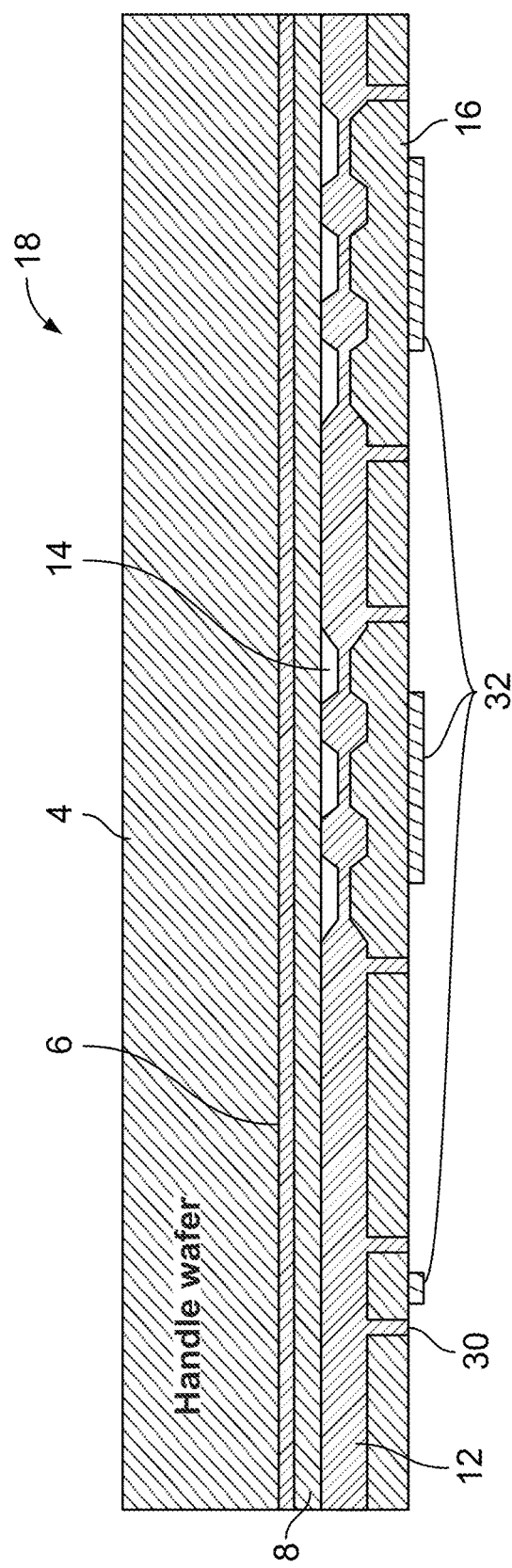

Referring to FIG. 18, according to an embodiment a method of manufacturing a CMUT device may comprise forming bond posts 32 directly on the CMUT substrate 16. In the embodiment the dielectric layer 28 is not is not necessary and not formed on the CMUT substrate 16 during manufacturing.

Figure 19:
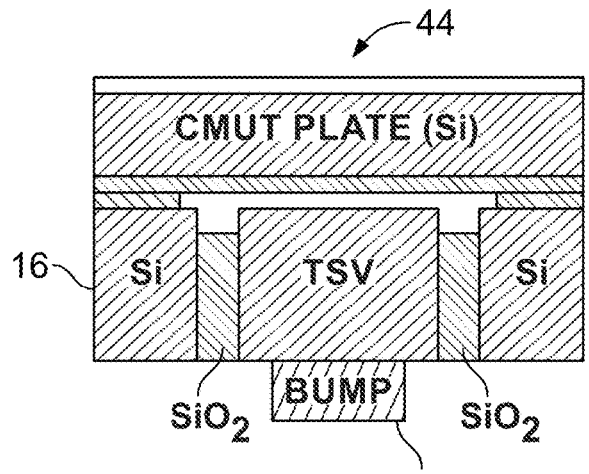
Figure 20:
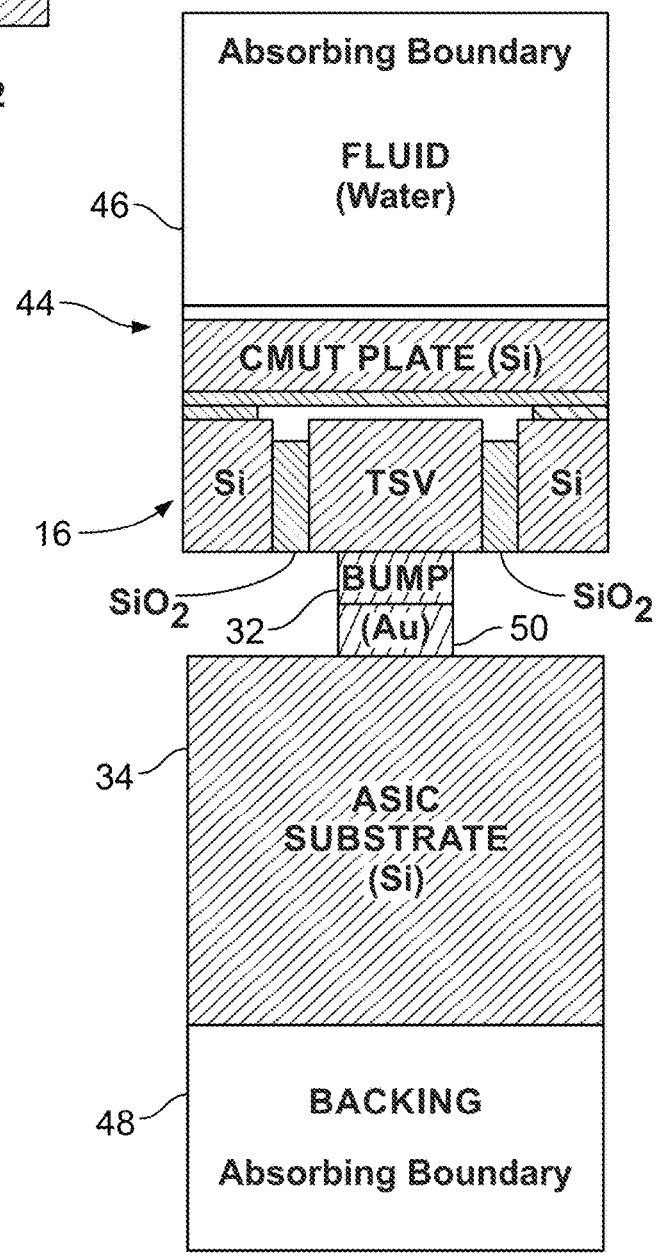

Referring to FIG. 19, a CMUT cell 44 is the smallest CMUT sensor entity of the CMUT device. Multiple CMUT cells can be connected in parallel, for example with an electrically common membrane or diaphragm to form a CMUT element. Generally speaking, the higher percentage of area a CMUT element is occupied by the active CMUT cells, the greater the ultrasonic output pressure with a larger bandwidth the element can generate. Referring to FIG. 20, a CMUT device comprises CMUT elements (formed of CMUT cells) connected to, for example, an ASIC 34 that is connected to the CMUT elements by bond posts 32. The ASIC 34 may comprise metal contacts 50 for connection to the bond posts 32 of the CMUT elements. The CMUT device may comprise a backing or absorbing boundary 48 connected to the ASIC 34. The CMUT device may be used in medical imaging, for example in an ultrasound imaging probe, in which an absorbing boundary 46, for example water, is used.

As noted above, it is difficult to make electrical connections from the ASIC to the CMUT top plate through a CMUT substrate having a thickness of, for example, 300 μm to 750 μm. TSV's through a CMUT substrate having such a thickness can create large parasitics and result in low CMUT efficiency. Applicants have also initially discovered that acoustic energy coupled into the CMUT substrate can cause substrate resonance which produces an undesirable ringing effect. For example, a 500 μm CMUT substrate may have a substrate resonance at around 8.3 MHz, which is within the imaging frequency range, which may generally be 1 MHz to 10 MHz. Additionally, CMUT substrate having such a thickness may also create spurious, or secondary, resonances which reduce the bandwidth of the CMUT device.

Figure 21:
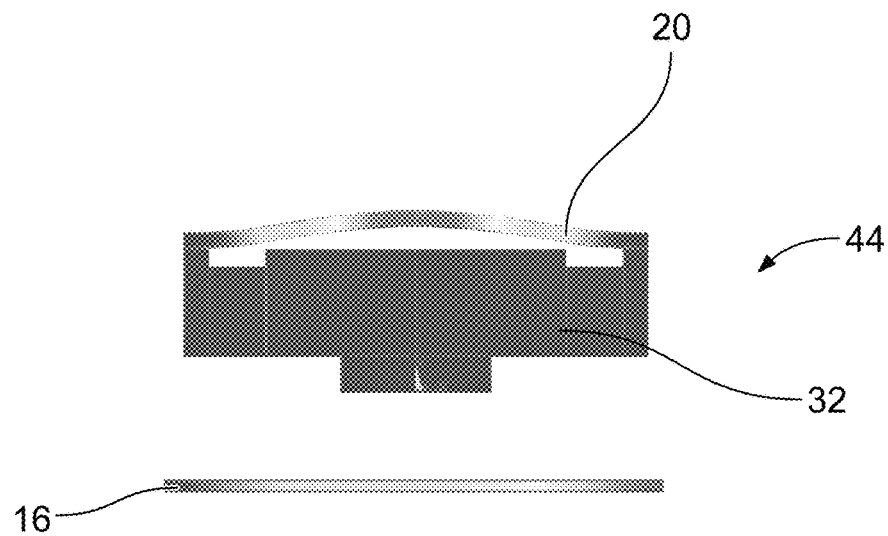
FIG. 21 illustrates a first axis-symmetric vibration mode of a CMUT diaphragm.
Figure 22:
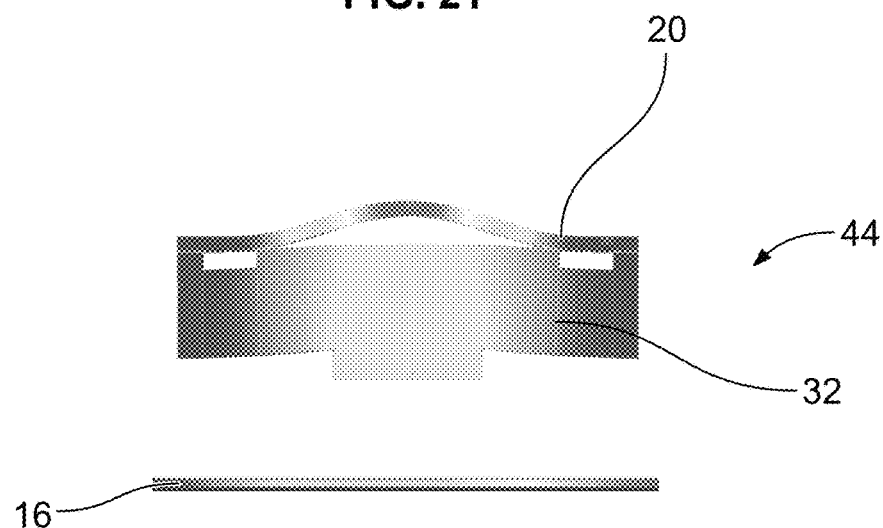
FIG. 22 illustrates a spurious vibration mode of a CMUT diaphragm.
Figure 23:
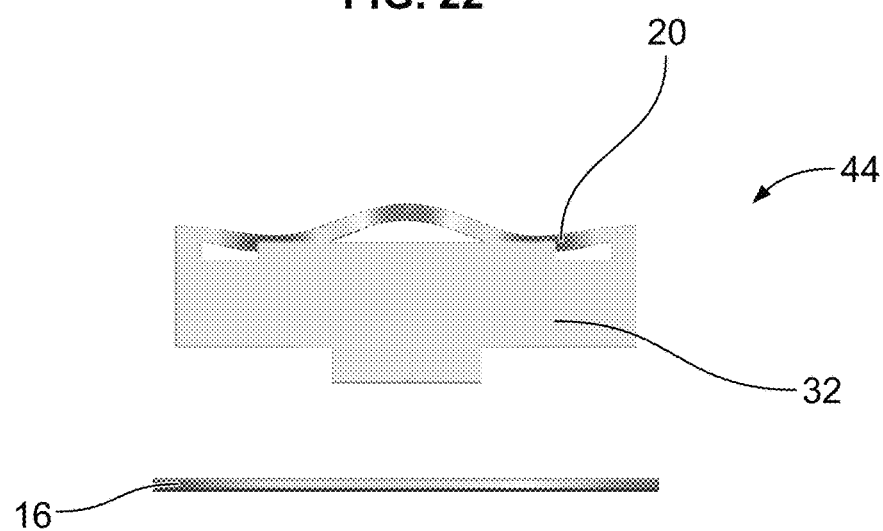
FIG. 23 illustrates a second axis-symmetric vibration mode of a CMUT diaphragm.

Referring to FIGS. 21-23, a CMUT cell having a CMUT substrate 16 with a thickness of 20 μm to 50 μm, for example 30 μm, and comprising a bond post 32 may experience different vibration modes. Assuming infinite rigidity of the CMUT substrate 16 the CMUT diaphragm 20 may vibrate in a first axis-symmetric mode as shown in FIG. 21, a spurious, or secondary, mode as shown in FIG. 22, or a second axis-symmetric mode as shown in FIG. 23. In the first axis-symmetric mode the frequency of the vibrations may be, for example, 4.1 MHz. In the spurious mode the frequency of the vibrations may be, for example, 9.8 MHz. In the second axis-symmetric mode the frequency of the vibrations may be, for example, 16.4 MHz. As noted above, the first axis-symmetric and the spurious mode vibration frequencies may be within the imaging frequency range of the CMUT device of, for example 1 MHz to 10 MHz. Referring to FIG. 24, the thickness of the CMUT substrate 16 can be chosen to move the spurious vibration mode frequency out of the imaging frequency range as much as possible. For example, a thickness of the CMUT substrate between about 20 μm to about 50 μm, for example 30 μm, provides a spurious mode frequency range that is out of the imaging frequency range as much as possible. Additionally, ultrasonic waves propagate through the CMUT substrate could produce undesirable substrate ringing effect due to the resonance of the CMUT substrate. Such an effect can be mitigated by having a thin CMUT substrate which pushes the substrate resonance frequency out of the imaging frequency range. The CMUT substrate having a thickness of 20 μm to 50 μm pushes the resonance of the of the CMUT substrate higher. For example, a CMUT substrate having thickness of about 30 μm has a resonance frequency of, for example, larger than 100 MHz.

Applicants also discovered that the placement of the bond posts and the bond post height may also be chosen to suppress spurious mode vibrations and/or move the spurious mode vibration frequency out of the frequency band of interest, for example an imaging frequency. The size, spacing, and placement of the bond posts may also be designed to reduce the ringing effect of the CMUT substrate caused by acoustic energy coupled into the CMUT substrate. Referring to FIGS. 25-28, the width or diameter 52 of the bond posts 32 may be, for example 10 μm to 40 μm and a height 54 of the bond posts 32 may be, for example, 1 μm to 10 μm. As shown in FIGS. 26-28, the bond posts 32 may be provided at a cavity 14 of each cell and in a hexagonal pattern around the cell. Other arrangements, including other polygonal arrangements, may provide acceptable results.

The embodiments described herein address the manufacturability issue associated with thin wafer handling challenges. The embodiments also improve efficiency of CMUT devices, by reducing the parasitics, and improve the bandwidth, by mitigating the spurious resonance modes and substrate ringing. It should be understood that not all embodiments may provide all of the effects described herein.

This written description uses examples to disclose the embodiments, including the best mode, and to enable a person of ordinary skill in the art to practice the embodiments, including making and using any devices or systems and performing any incorporated methods. The claims define the patentable scope of the disclosure, and include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A method of forming a capacitive micromachined ultrasonic transducer (CMUT) device, comprising:
   bonding a CMUT substrate to a silicon on insulator (SOI) substrate, the CMUT substrate having a first thickness, the SOI substrate including a handle, a buried oxide layer, and a device layer, at least one of the CMUT substrate or the SOI substrate including a patterned dielectric layer, wherein the device layer is bonded to the patterned dielectric layer to form a plurality of sealed cavities and the device layer forms a diaphragm of the plurality of cavities;
   reducing the first thickness of the CMUT substrate to a second thickness; and
   forming a plurality of through-silicon vias from a second surface of the CMUT substrate opposite a first surface.

2. The method of claim 1, further comprising:
   forming a second dielectric layer on the second surface.

3. The method of claim 2, further comprising:
   forming a plurality of metal bond posts through and on the second dielectric layer.

4. The method of claim 3, further comprising:
   attaching a CMOS device to the metal bond posts.

5. The method of claim 2, further comprising:
   removing portions of the handle and buried oxide layer of the SOI substrate, wherein removed portions of the handle and the buried oxide layer form channels in the SOI substrate, the channels exposing the diaphragm and being separated from the sealed cavities by the diaphragm.

6. The method of claim 5, wherein the channels are between 300 μm and 500 μm in length.

7. The method of claim 5, further comprising:
   etching a portion of the diaphragm and a portion of the first dielectric layer to form a contact area; and
   forming a metal layer over the diaphragm and a portion of the first dielectric layer to form a contact.

8. The method of claim 3, wherein a diameter of the bond posts is between 10 μm and 40 μm and a height of the bond posts is between 1 μm and 20 μm.

9. The method of claim 3, further comprising:
   attaching a glass substrate having a plurality of metal vias formed through the glass substrate and on a surface of the glass substrate to the metal bond posts.

10. The method of claim 9, further comprising:
    removing the handle and buried oxide layer from the SOI substrate.

11. The method of claim 10, wherein the handle is removed after attaching the glass substrate.

12. The method of claim 9, further comprising:
    etching a portion of the diaphragm and a portion of the first dielectric layer to form a contact area; and
    forming a metal layer over the diaphragm and a portion of the first dielectric layer to form a contact.

13. The method of claim 3, wherein the bond posts are formed in a center of each cell of the CMUT device and in a polygonal arrangement around the center of each cell of the CMUT device.

14. The method of claim 1, further comprising:
    forming a plurality of metal bond posts directly on the second surface.

15. The method of claim 14, further comprising:
    attaching a CMOS device to the metal bond posts.

16. The method of claim 1, further comprising:
    prior to reducing the first thickness of the CMUT substrate to the second thickness, removing the handle and the buried oxide layer from the SOI substrate;
    etching a portion of the diaphragm and a portion of the first dielectric layer to form a contact area;
    forming a metal layer over the diaphragm and a portion of the first dielectric layer to form a contact; and
    bonding a cap to the CMUT substrate on the first surface over the diaphragm and metal layer.

17. The method of claim 16, further comprising:
    removing the cap from the CMUT substrate.

18. The method of claim 1, wherein the first thickness is between 300 μm and 750 μm and the second thickness is between 20 μm and 50 μm.

19. The method of claim 18, wherein the second thickness is 30 μm.

20. A CMUT device manufactured according to the method of claim 1.

* * * * *